United States Patent

Bridger et al.

[11] Patent Number: 6,078,055
[45] Date of Patent: Jun. 20, 2000

[54] PROXIMITY LITHOGRAPHY DEVICE

[75] Inventors: Paul M. Bridger; Thomas C. McGill, both of Pasadena, Calif.

[73] Assignee: California Institute of Technology, Pasadena, Calif.

[21] Appl. No.: 09/044,082

[22] Filed: Mar. 18, 1998

Related U.S. Application Data

[60] Provisional application No. 60/039,361, Mar. 19, 1997.

[51] Int. Cl.[7] .................................................. H01J 37/304
[52] U.S. Cl. ........................................................ 250/492.2
[58] Field of Search ................................ 250/492.2, 306, 250/307, 492.22, 492.3

[56] References Cited

U.S. PATENT DOCUMENTS 5,384,464  1/1995  De Fornel et al. .................. 250/492.2
5,763,933  6/1998  White ................................. 250/492.2

*Primary Examiner*—Kiet T. Nguyen
*Attorney, Agent, or Firm*—Fish & Richardson P.C.

[57] ABSTRACT

A proximity lithography device using a modified electric field. In the preferred embodiment, the modified electric field is formed by illuminating a tip of a scanning probe in close proximity of the resist surface with a laser. In an alternate embodiment, the modified electric field is formed by positioning a tip of a scanning probe within close proximity of the resist surface, where illumination from a laser is in total internal reflection within the resist. The proximity of the tip to the resist surface creates a tunneling effect and forms the modified electric field. The modified electric field alters the resist for lithographic patterning.

10 Claims, 5 Drawing Sheets

PROXIMITY LITHOGRAPHY DEVICE

This application claims the benefit of U.S. Provisional Application Ser. No. 60/039,361, filed Mar. 19, 1997.

TECHNICAL FIELD

The invention relates to a device used in lithography in microchip fabrication, and more particularly to a device which performs lithography by manipulating an electric field in close proximity to a resist.

BACKGROUND OF THE INVENTION

Microchip fabrication is a cornerstone of modern technology. As integrated circuits ("ICs") have become staple items in devices in all areas, the fabrication process for ICs has developed rapidly. Central to the fabrication process is the patterning of a substrate in accordance with the configuration of a desired feature set.

Conventional patterning typically utilizes photolithography in the patterning process. Multiple forms of photolithography are commonly used. Each includes several similar basic steps. A photoresist film is applied to a substrate surface to be patterned. Photoresist is a light-sensitive material that has properties which change upon exposure to light. A mask is then aligned to the substrate. The mask contains a pattern of the desired pattern to be transferred to the substrate. The photoresist film is then exposed to light, where the mask obscures portions of the photoresist from the light. A developer or solvent is then applied to remove a portion of the photoresist, according to the reaction of the photoresist to exposure. An etchant is applied again to pattern the substrate through the holes formed in the photoresist. Finally, any remaining photoresist is stripped away, leaving a patterned substrate.

A significant limitation of photolithography is the resolution capability of optical photolithography. The smallest openings which are created are limited by the smallest areas which can be defined by the mask and exposure on the photoresist. Conventional photolithography is typically limited to about 125 to 200 micrometers. As resolution capability improves, the number of devices which may be included in a single IC increases, improving the efficiency and performance of the IC. In addition, improved resolution capability typically raises wafer yield.

Alternate forms of resist may be used in lithographic processes. Photoresist changes in response to exposure to light. Other resists change in response to different events. Some resists alter in response to an electric field applied to the resist.

Accordingly, the inventors have determined that it would be desirable to provide a device for lithography which has an improved resolution capability relative to conventional photolithography technology using modification of an electric field to alter a resist for lithographic patterning.

SUMMARY

A lithographic device of the preferred embodiment provides patterning of a resist through manipulation of an electric field at an evanescent field level.

One known way to alter an electric field is to illuminate a tip of a probe with a laser. The tip used is typically of a nanometer scale, or even better, atomically sharp. In an area near the tip, the electric field becomes stronger under illumination. The electric field is particularly strong within the near field of the tip, decaying rapidly with distance from the tip. Thus, a spatially very small electric field may be manipulated in this way.

In one embodiment, a nanometrically fine tip of a scanning probe is brought into close proximity of a surface of a resist to be patterned. The resist is sensitive to variations in electric fields, similar to a photoresist's sensitivity to light exposure. A laser illuminates the tip, creating a modified electric field in the evanescent field surrounding the tip. The modified electric field alters the resist's properties in the portion of the resist which coincides with the position of the modified electric field. The tip is moved across the surface of the resist according to a pattern, such that a desired portion of the resist is altered.

In another embodiment, a nanometrically fine tip of a scanning probe is brought into close proximity with an upper surface of a resist to be patterned. Again, the resist is sensitive to variations in electric fields. A laser permeates the resist from the lower side at an angle less than the critical angle, such that substantially no light penetrates the upper surface. A tunneling effect is created by the close proximity of the tip to the upper surface of the resist. The tunneling effect modifies the electric field in the evanescent field surrounding the tip. The modified electric field alters the resist's properties in the portion of the resist which coincides with the position of the modified electric field. The tip is moved across the surface of the resist according to a pattern, such that a desired portion of the resist is altered.

DETAILED DESCRIPTION

Embodiments of the present invention will be described with reference to the figures. A preferred embodiment is a proximity lithography device which uses apertureless proximity lithography to pattern a resist. One alternate embodiment is a proximity lithography device which uses tunneling apertureless lithography to pattern a resist.

Figure 1A:
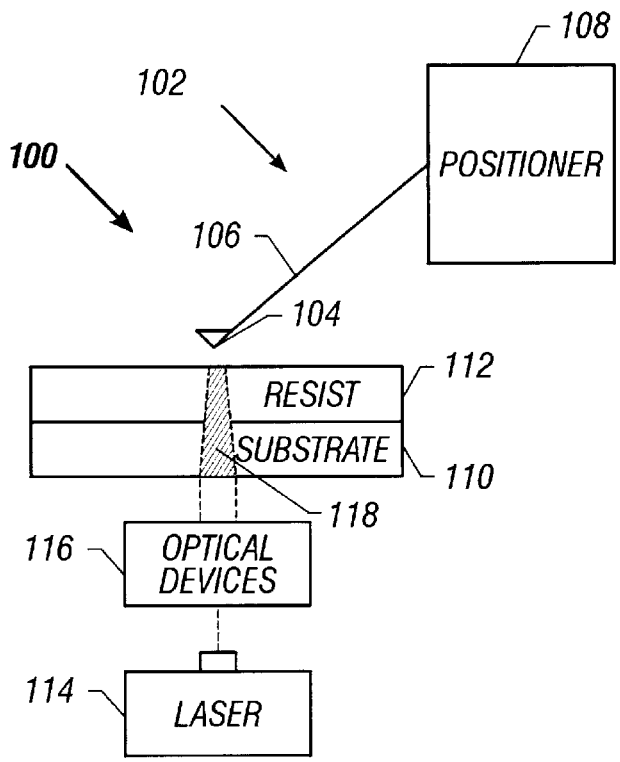
FIG. 1A shows a proximity lithography device of the preferred embodiment.

FIG. 1A illustrates a proximity lithography device 100 of the preferred embodiment. Proximity lithography device 100 includes a scanning probe 102. Scanning probe 102 is preferably an atomic force microscope ("AFM"), a scanning tunneling microscope ("STM"), or some variant. Scanning probe 102 includes a tip 104. Tip 104 is preferably nanometrically small, i.e., less than 100 nanometers in width or diameter at a distal end. Tip 104 is more preferably between approximately one and 40 nanometers in width or diameter, and even more preferably atomically sharp. Tip 104 may be made of a dielectric, and more preferably is made of metal or a dielectric coated with a metal. Tip 104 is connected by a flexible bar 106 to a positioner 108. Positioner 108 is preferably a piezoelectric positioner which has a very fine position resolution, preferably in the one nanometer range.

A substrate 110 is positioned below scanning probe 102. A resist 112 is formed on substrate 110. Preferably, the surface of resist 112 to be patterned defines a plane perpendicular to the axis of tip 104. Tip 104 is in close proximity to resist 112. Preferably, tip 104 is less than approximately 20 nanometers distant from resist 112, and more preferably approximately 2 nanometers distant.

Positioner 108 moves scanning probe 102 horizontally, i.e., left and right, forwards and backwards, across the surface of resist 112 in response to control signals generated according to a supplied pattern to be transferred to resist 112. Alternately, positioner 108 horizontally moves scanning probe 102 in response to control signals manually entered by a user. Positioner 108 moves scanning probe 102 vertically, i.e., up and down, above resist 112 in response to feedback from scanning probe 102 to maintain an approximately constant distance between tip 104 and resist 112.

Figure 1B:
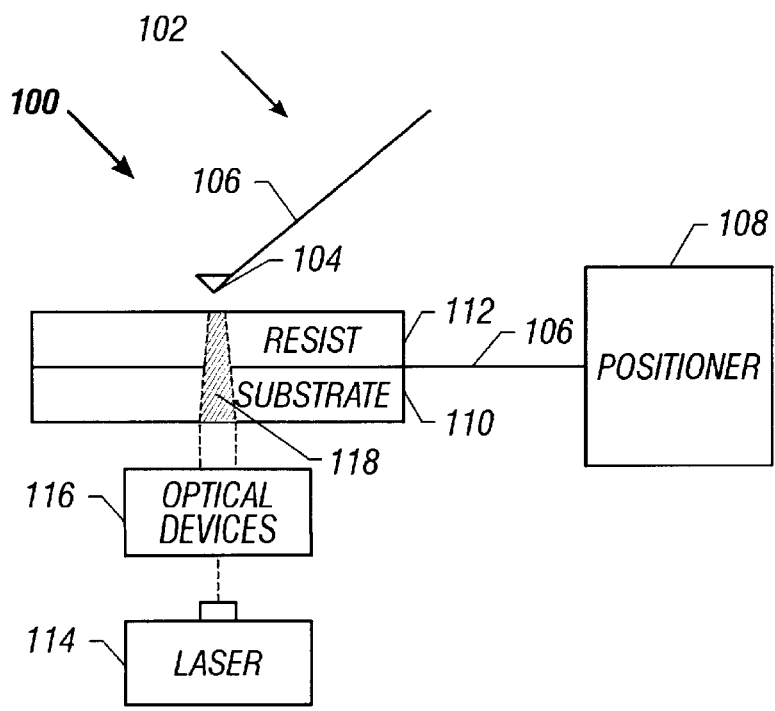
FIG. 1B shows a proximity lithography device of an alternate embodiment.

Alternately, as shown in FIG. 1B, positioner 108 may be attached to substrate 110 by flexible bar 106. In this way, positioner 108 moves substrate 110 and resist 112 relative to tip 104.

Returning to FIG. 1A, a laser 114 is positioned below substrate 110 and resist 112, such that a beam of light emanating from laser 114 is parallel to the axis of tip 104. Optical devices 116 are positioned between laser 114 and substrate 110. Laser 114 emanates a beam of light which is focused and directed by optical devices 116 to pass through substrate 110 and resist 112 to illuminate tip 104. The area of substrate 110 and resist 112 illuminated by laser 114 is indicated by illumination 118.

Figure 1C:
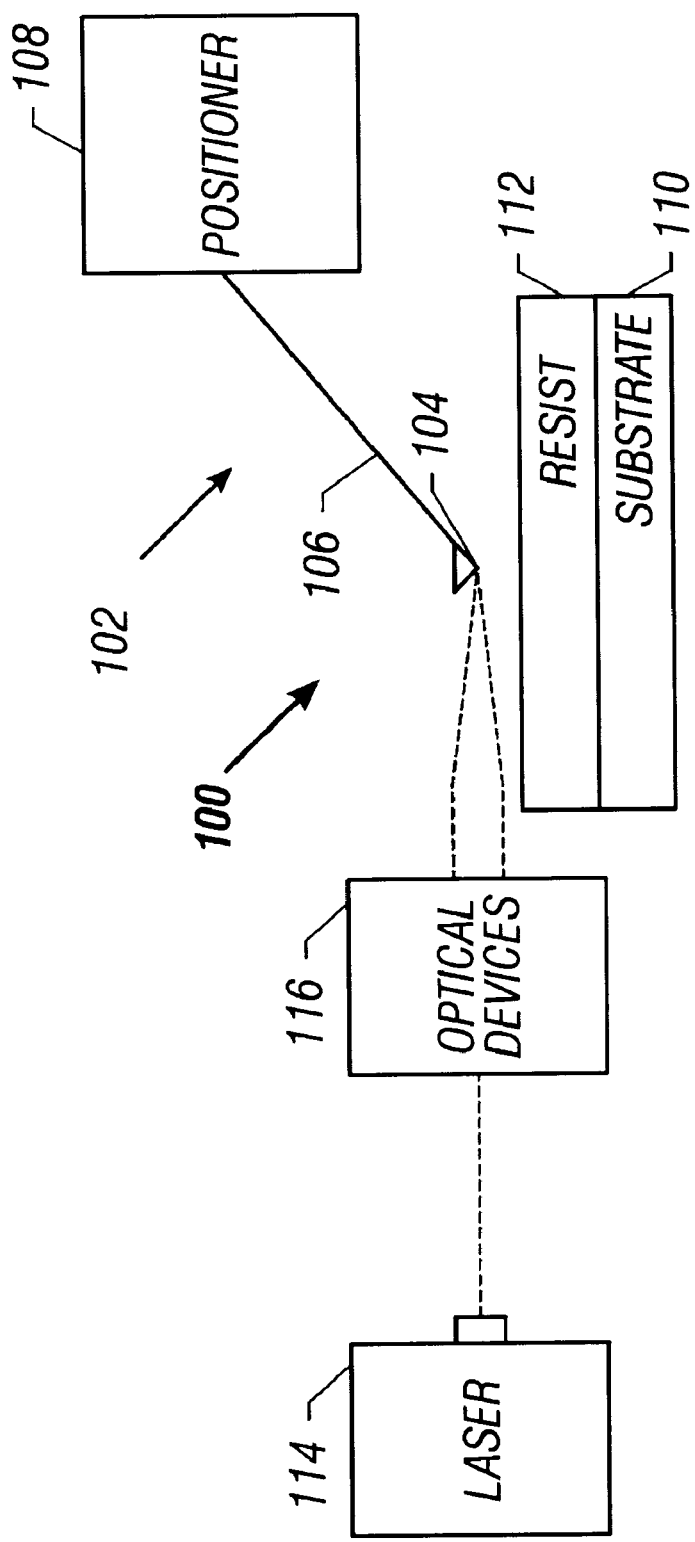
FIG. 1C shows a proximity lithography device of an alternate embodiment.

Alternately, as shown in FIG. 1C, laser 114 and optical devices 116 are positioned such that a beam of light emanating from laser 114 is perpendicular to the axis of tip 104 and illuminates tip 104 without passing through substrate 110 and resist 112. In alternate embodiments, laser 114 and optical devices 116 may be positioned at any angle relative to the axis of tip 104 between the extremes shown in FIG. 1A and FIG. 1C to illuminate tip 104.

Resist 112 is preferably selected so that an unmodified electric field generated by the illumination from laser 114 does not alter resist 112. Resist 112 is altered by an electric field of magnitude greater than the magnitude of the electric field from illumination of laser 114.

The illumination of tip 104 by laser 114 modifies the electric field produced by the illumination of laser 114 in the evanescent field of tip 104. The modified electric field in the evanescent field surrounding tip 104 has a higher magnitude than the electric field of other areas illuminated by laser 114. The modified electric field preferably has a magnitude sufficient to alter resist 112. Thus, the modified electric field surrounding tip 104 is used to pattern resist 112.

The modified electric field is spatially very small. Tip 104, as described above, is preferably nanometrically small. The modified electric field is preferably limited to the near field of tip 104, decaying rapidly with distance from tip 104, e.g., decaying with the square of the distance. Thus, the portion of resist 112 affected at a given time by the modified electric field is also very small. This size allows lithographic patterning resulting in resolution capabilities preferably below approximately 100 nanometers, and more preferably less than approximately 50 nanometers. Thus, the preferred embodiment provides a substantial improvement over conventional photolithography resolution capabilities, e.g., approximately 125 nanometers.

Figure 2:
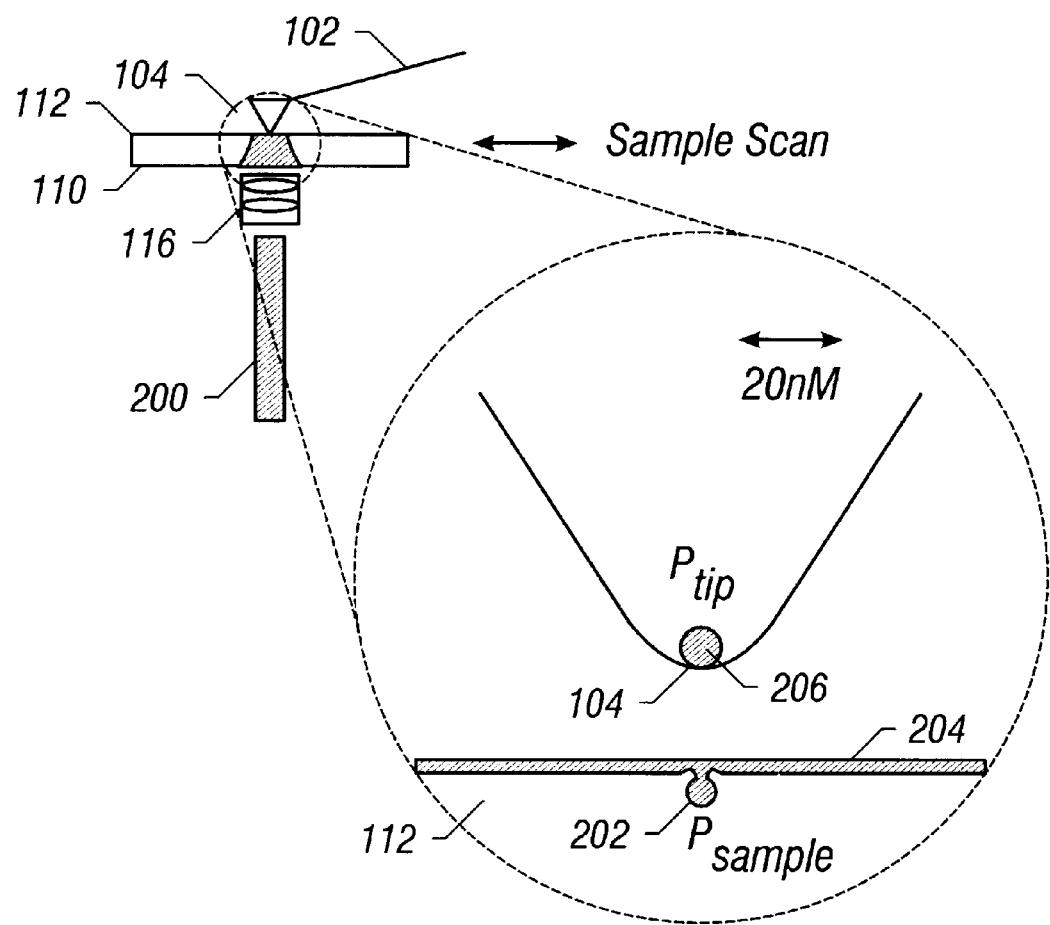
FIG. 2 shows a sample scan by a proximity lithography device of the preferred embodiment.

FIG. 2 illustrates a sample scan by proximity lithography device 100 using apertureless proximity lithography. Illumination 200 from laser 114 (not shown in FIG. 2) enters optical devices 116. Optical devices 116 focus and directs illumination 200 to pass through substrate 110 and resist 112 to illuminate tip 104 of scanning probe 102. The illumination of resist 112 forms a dipole 202 in an upper surface 204 of resist 112. Where tip 104 is a dielectric, the illumination of tip 104 forms a dipole 206 in tip 104. The interaction between dipole 202 and dipole 206 modifies the electric field surrounding tip 104. Where tip 104 is a metal or a dielectric coated with a metal, it is believed that the illumination of tip 104 forms electrostatic free charge and surface enhanced raman field enhancement creating a modified electric field.

This modified electric field extends outward from tip 104 within the near field of tip 104, decaying with distance from tip 104. Resist 112 is preferably sensitive to the modified electric field such that the properties of resist 112 alter when subjected to the modified electric field. Resist 112 may change from soluble to less soluble (similar to a conventional negative photoresist) or from relatively nonsoluble to more soluble (similar to a conventional positive photoresist) when subjected to the modified electric field depending on the nature of resist 112. In this way, a portion of resist 112 is altered, similar to the exposure of photoresist to light in conventional photolithography. Resist 112 may be made of a type of photoresist which is susceptible to alteration from electric fields.

Scanning probe 102 is moved across resist 112 by positioner 108 (not shown in FIG. 2) according to a supplied pattern to be formed in resist 112 (or resist 112 may be moved by positioner 108, as described above). At points where resist 112 is to be altered, scanning probe 102 stops and laser 114 illuminates tip 104, as described above. In this way, the supplied pattern of alterations is applied to resist 112.

An alternate embodiment uses tunneling apertureless proximity lithography to alter portions of a resist according to a supplied pattern. The physical construction of the device is the same as shown in FIG. 1, except for the positioning of laser 114 and optical devices 116. As in the preferred embodiment, resist 112 is selected so that resist 112 is not altered by the unmodified electric field from illumination of laser 114.

In a proximity lithography device using tunneling apertureless proximity lithography, laser 114 and optical devices 116 are positioned and operate to use total internal reflection of substrate 110 and resist 112. A beam of light enters substrate 110 and resist 112 at an angle greater than a critical angle for the materials. The critical angle for a material in a particular configuration is determined by the optical properties for that material in that configuration. When light enters a surface of a first material at an angle relative to an opposite surface of the material, if that angle is greater than the critical angle, the light does not pass through the opposing surface of the material if the index of refraction of material adjoining the opposite surface is lower than the index of refraction of the first material. Instead, the light is completely reflected within the material. This situation is referred to as "total internal reflection". Thus, laser 114 and optical devices 116 are positioned and operate so that light from laser 114 is focused by optical devices 116 to enter substrate 110 and resist 112 at an angle greater than the critical angle for substrate 110 and resist 112. No light emerges from the upper surface of resist 112 because the index of refraction of resist 112 is higher than the index of refraction of the air adjoining the upper surface of resist 112.

Figure 3:
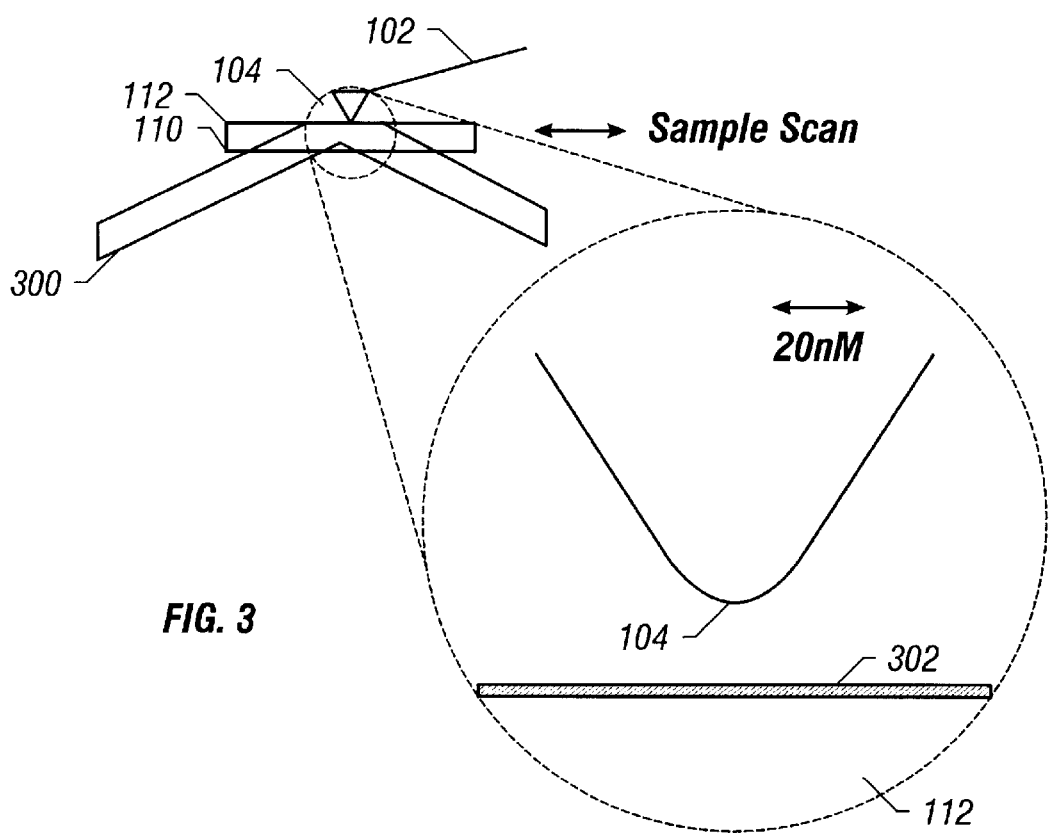
FIG. 3 shows a sample scan by a proximity lithography device of an alternate embodiment.

FIG. 3 illustrates a sample scan by proximity lithography device 100 using tunneling apertureless proximity lithography. An illumination 300 from laser 114 and focused by optical devices 116 enters substrate 110 and resist 112 at an angle greater than the critical angle. Accordingly, substantially no light emerges from an upper surface 302 of resist 112.

When tip 104 is positioned in close proximity to resist 112, such that the illumination contained within resist 112 falls within the evanescent field of tip 104, a tunneling effect is created. The index of refraction of tip 104 is higher than the index of refraction of the surrounding air. Thus, the total internal reflection within resist 112 is disrupted in the evanescent field of tip 104, creating the tunneling effect. The illumination 300 within resist 112 modifies an electric field surrounding tip 104 due to the tunneling effect. The modified electric field preferably has a magnitude large enough to alter resist 112. Thus, the portion of resist 112 which is subjected to the modified electric field is altered, as in the preferred embodiment. In this way, a portion of resist 112 is altered.

As in the preferred embodiment, scanning probe 102 is moved across resist 112, altering portions of resist 112 according to a supplied pattern using the tunneling effect to create a modified electric field.

Figure 4A:
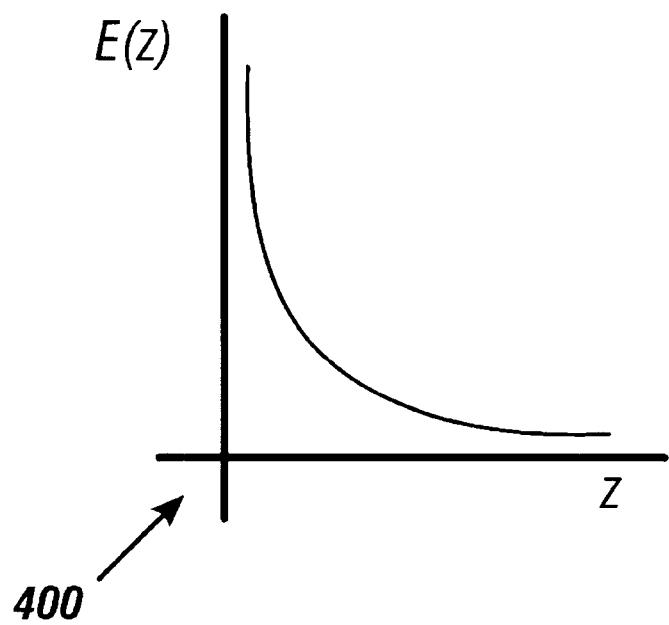
FIG. 4A is a graph of an electric field above a resist in an alternate embodiment.

FIG. 4A shows a graph 400 of magnitude E(z) of the electric field above upper surface 302 of resist 112 when illumination is contained within resist 112 as described above. Magnitude E(z) varies with distance from upper surface 302, as represented by variable z, the horizontal axis of graph 400.

Figure 4B:
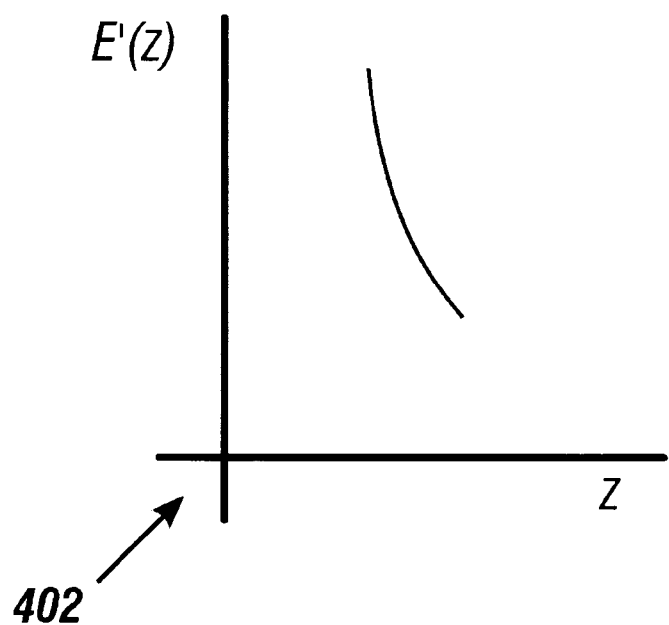
FIG. 4B is a graph of an electric field above a resist when a tip of a scanning probe of an alternate embodiment is in close proximity to the resist.

FIG. 4B shows a graph 402 of magnitude E'(z) of the electric field above upper surface 302 of resist 112 in close proximity to tip 104 when illumination is contained within resist 112 and tip 104 is in close proximity to upper surface 302. As in graph 400, magnitude E'(z) varies with distance from upper surface 302, as represented by variable z, the horizontal axis of graph 402. In contrast to graph 400, magnitude E'(z) is larger at a greater distance from upper surface 302. This increased magnitude results from the modified electric field around tip 104 formed by the tunneling effect, as described above.

As in the preferred embodiment the modified electric field is within the near field of tip 104, decaying rapidly with distance from tip 104, and so affects a correspondingly small portion of resist 112 at any given time. Thus, the alternate embodiment provides similar resolution capabilities as the preferred embodiment.

Accordingly, a proximity lithography device of the claimed invention alters a resist using a modified electric field. In the preferred embodiment, the modified electric field is formed by illuminating a tip of a scanning probe in close proximity of the resist surface with a laser. In an alternate embodiment, the modified electric field is formed by positioning a tip of a scanning probe within close proximity of the resist surface, where illumination from a laser is in total internal reflection within the resist. The proximity of the tip to the resist surface creates a tunneling effect and forms the modified electric field.

Various embodiments of the claimed invention have been described. These embodiments are illustrative and not limiting. The scope of the invention is limited only by the scope of the following claims.

What is claimed is:

1. A proximity lithography device for patterning a resist, comprising:

a scanning probe including a tip having an end portion with a dimension less than approximately 100 nanometers;

a positioner coupled to the scanning probe and operable to move said tip;

a laser which emanates a beam toward said tip; and optical devices which focus the beam from the laser to illuminate the tip in a way that causes said resist to react in a way that tends to change a characteristic of the resist when said tip is brought close to the resist.

2. The proximity lithography device of claim 1 where said change in said resist is brought about by said tip and said beam which is in total internal reflection within the resist.

3. The proximity lithography device of claim 1 where said scanning probe is positioned on one side of said resist and said laser and optical devices are positioned on a different side of the resist.

4. The proximity lithography device of claim 1 where said dimension of said end portion of said tip is less than approximately 40 nanometers.

5. The proximity lithography device of claim 1 where said end portion of said tip is atomically sharp.

6. The proximity lithography device of claim 1 where said tip is positioned less than approximately 20 nanometers from said resist.

7. The proximity lithography device of claim 1 where said positioner is a piezoelectric positioner.

8. The proximity lithography device of claim 1 where said tip is made from metal.

9. A proximity lithography device for patterning a resist, comprising:

a scanning probe including a tip having an end portion with a dimension less than approximately 100 nanometers;

a positioner coupled to the resist and operable to move said resist;

a laser which emanates a beam toward said tip; and optical devices which focus the beam from the laser to illuminate the tip in a way that causes said resist to react in a way that tends to change a characteristic of the resist when said tip is brought close to the resist.

10. A proximity lithography device for patterning a resist, comprising:

a scanning probe including a tip having an end portion with a dimension less than 100 nanometers;

a positioner coupled to the scanning probe and operable to move said tip;

a laser which emanates a beam towards said tip; and optical devices which focus the beam from the laser to be totally internally reflected within the resist, and in a way where said scanning probe affects the beam in the resist.

* * * * *

UNITED STATES PATENT AND TRADEMARK OFFICE
CERTIFICATE OF CORRECTION

PATENT NO. : 6,078,055
DATED : JUNE 20, 2000
INVENTOR(S) : PAUL M. BRIDGER AND THOMAS C. MCGILL

It is certified that error appears in the above-identified patent and that said Letters Patent is hereby corrected as shown below:

```
                              Column 1, before line 1, insert

--U.S. Government may have certain rights in this invention pursuant to ONR grant number N00014-92-J-1845.--
```

Signed and Sealed this

Twenty-second Day of May, 2001

Attest:

NICHOLAS P. GODICI

*Attesting Officer*    *Acting Director of the United States Patent and Trademark Office*